US012748153B2

(12) United States Patent
Cha et al.

(10) Patent No.: US 12,748,153 B2
(45) Date of Patent: Sep. 29, 2026

(54) LOW-VOLTAGE DEFECT INSPECTION METHOD OF LITHIUM SECONDARY BATTERY AND MANUFACTURING METHOD OF LITHIUM SECONDARY BATTERY

(71) Applicant: LG ENERGY SOLUTION, LTD., Seoul (KR)

(72) Inventors: In Young Cha, Daejeon (KR); Nak Gi Sung, Daejeon (KR); Joon Sup Kang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 162 days.

(21) Appl. No.: 18/277,962

(22) PCT Filed: Jan. 9, 2023

(86) PCT No.: PCT/KR2023/000372
§ 371 (c)(1),
(2) Date: Jan. 26, 2024

(87) PCT Pub. No.: WO2023/146161
PCT Pub. Date: Aug. 3, 2023

(65) Prior Publication Data

US 2025/0277858 A1 Sep. 4, 2025

(30) Foreign Application Priority Data

Jan. 25, 2022 (KR) ........................ 10-2022-0010369

(51) Int. Cl.
*G01R 31/3835* (2019.01)
*G01R 31/378* (2019.01)
*H01M 4/04* (2006.01)

(52) U.S. Cl.
CPC ....... *G01R 31/3835* (2019.01); *G01R 31/378* (2019.01); *H01M 4/0445* (2013.01)

(58) Field of Classification Search
None
See application file for complete search history.

(56) References Cited

U.S. PATENT DOCUMENTS 9,205,750 B2 12/2015 Bernardi et al.
2016/0214500 A1 7/2016 Kim et al.
(Continued)

FOREIGN PATENT DOCUMENTS

CN 101479877 A 7/2009
CN 102163839 A 8/2011
(Continued)

OTHER PUBLICATIONS

International Search Report issued in PCT/KR2023/000372 (PCT/ISA/210), mailed on May 8, 2023.
(Continued)

*Primary Examiner* — Jermele M Hollington
(74) *Attorney, Agent, or Firm* — Birch, Stewart, Kolasch & Birch, LLP

(57) ABSTRACT

An inspection method for a low-voltage defect of a lithium secondary battery includes performing a microcurrent charging/discharging process having N charging/discharging sections, N being an integer of 2 or more, and for each charging/discharging section, applying a microcurrent to the lithium secondary battery; measuring a change in voltage of the lithium secondary battery before and after each charging/discharging section; and screening for the low-voltage defect of the lithium secondary battery based on the measured change in voltage. The lithium secondary battery
(Continued)

having the low-voltage defect is not shipped. The microcurrent for each charging/discharging section is at a current rate of 0.000001 C to 0.0001 C.

13 Claims, 3 Drawing Sheets

(56) References Cited

U.S. PATENT DOCUMENTS

| | | | | |
|---|---|---|---|---|
| 2016/0291093 | A1 | 10/2016 | Matsuyama et al. | |
| 2018/0164384 | A1 | 6/2018 | Kwon et al. | |
| 2018/0183091 | A1 | 6/2018 | Ichikawa et al. | |
| 2019/0033380 | A1 | 1/2019 | Kim et al. | |
| 2019/0288344 | A1 | 9/2019 | Nakao et al. | |
| 2021/0135304 | A1 | 5/2021 | Lee et al. | |
| 2021/0382114 | A1 | 12/2021 | Oyama et al. | |
| 2022/0043068 | A1 | 2/2022 | Lee et al. | |
| 2022/0077491 | A1 | 3/2022 | Kim et al. | |
| 2022/0137145 | A1 | 5/2022 | Lee | |
| 2024/0356345 | A1* | 10/2024 | Park | B60L 53/305 |

FOREIGN PATENT DOCUMENTS

| | | | | |
|---|---|---|---|---|
| CN | 110794316 | A | 2/2020 | |
| CN | 112888954 | A | 6/2021 | |
| CN | 113109729 | A | 7/2021 | |
| CN | 113875058 | A | 12/2021 | |
| EP | 2 360 806 | A2 | 8/2011 | |
| EP | 3121613 | A1 | 1/2017 | |
| EP | 3517986 | A2 | 7/2019 | |
| EP | 3 859 383 | A1 | 8/2021 | |
| EP | 3886236 | A1 | 9/2021 | |
| EP | 4007039 | A1 | 6/2022 | |
| EP | 4276973 | A1 * | 11/2023 | G01R 31/392 |
| JP | 2000-88933 | A | 3/2000 | |
| JP | 2000-338202 | A | 12/2000 | |
| JP | 2001-351696 | A | 12/2001 | |
| JP | 2002-352864 | A | 12/2002 | |
| JP | 2008-288192 | A | 11/2008 | |
| JP | 2011-112453 | A | 6/2011 | |
| JP | 5203356 | B2 | 6/2013 | |
| JP | 2013-246095 | A | 12/2013 | |
| JP | 2014-6205 | A | 1/2014 | |
| JP | 2016-192278 | A | 11/2016 | |
| JP | WO2017/199629 | A1 | 11/2017 | |
| JP | 2018-55910 | A | 4/2018 | |
| JP | 2019-113450 | A | 7/2019 | |
| JP | 2021-21686 | A | 2/2021 | |
| JP | 6927666 | B2 | 9/2021 | |
| KR | 10-2015-0021825 | A | 3/2015 | |
| KR | 10-2018-0071798 | A | 6/2018 | |
| KR | 10-2018-0081009 | A | 7/2018 | |
| KR | 10-2064459 | B1 | 1/2020 | |
| KR | 10-2020-0039215 | A | 4/2020 | |
| KR | 10-2020-0059483 | A | 5/2020 | |
| KR | 10-2020-0084510 | A | 7/2020 | |
| KR | 10-2020-0107171 | A | 9/2020 | |
| KR | 10-2020-0129518 | A | 11/2020 | |
| KR | 10-2194845 | B1 | 12/2020 | |
| WO | WO 94/05068 | A1 | 3/1994 | |
| WO | WO 2015/141500 | A1 | 9/2015 | |
| WO | WO 2017/002615 | A1 | 1/2017 | |
| WO | WO 2020/090143 | A1 | 5/2020 | |
| WO | WO 2021/101041 | A1 | 5/2021 | |

OTHER PUBLICATIONS

Extended European Search Report for European Application No. 23747204.8, dated Jul. 22, 2024.

"What are the three things you need to check to buy a safe 18650 battery," LED Work Lights Online Store, NLA Select/Blog, URL: https://led-outdoorgear.biz/wp/18650-pse/, Apr. 1, 2019, 26 pages.

Takahashi et al., "Evaluation Methods of the SOH for Reusing Lithium Ion batteries" 2020 JSAE Annual Congress (Spring) Proceedings, May 15, 2020, 8 pages, with an English abstract.

Web page showing the date of publication of the URL, URL: https://led-outdoorgear.biz/wp/18650-pse/, Apr. 1, 2019 (retrieved on Oct. 15, 2025), 3 pages.

Acknowledgement of receipt issued in European Patent No. 23747204.8, dated Apr. 2, 2026, including Certificate pf publication of the Society of Automotive Engineers of Japan (JSAE) (May 15, 2020).

Communication of a Notice of Opposition issued in European Patent No. 23747204.8, dated Mar. 26, 2026.

Communication of further Notices of Opposition issued in European Patent No. 23747204.8, dated Apr. 8, 2026.

Communication of Notice of Opposition issued in European Patent No. 23747204.8, dated on Apr. 8, 2026.

English Translation of Takahashi et al., "Evaluation Methods of the SOH for Reusing Lithium Ion batteries" 2020 JSAE Annual Congress (Spring) Proceedings, May 15, 2020, 11 pages.

Notice of Opposition issued in European Patent No. 23747204.8, dated Apr. 8, 2026.

Page of the content of the DVD of the 2020 Society of Automotive Engineers of Japan (JSAE) Annual Congress (Spring) Proceedings including the listing of paper 202.

Print out of Copyright Notice of DVD of the DVD of the 2020 Society of Automotive Engineers of Japan (JSAE) Annual Congress (Spring) Proceedings, ISSN 2189-4558.

Starting page of the DVD of the 2020 Society of Automotive Engineers of Japan (JSAE) Annual Congress (Spring) Proceedings.

Two photographs showing a DVD of the 2020 Society of Automotive Engineers of Japan (JSAE) Annual Congress (Spring) Proceedings, ISSN 2189-4558, and its DVD case and cover.

* cited by examiner

[FIG. 1]
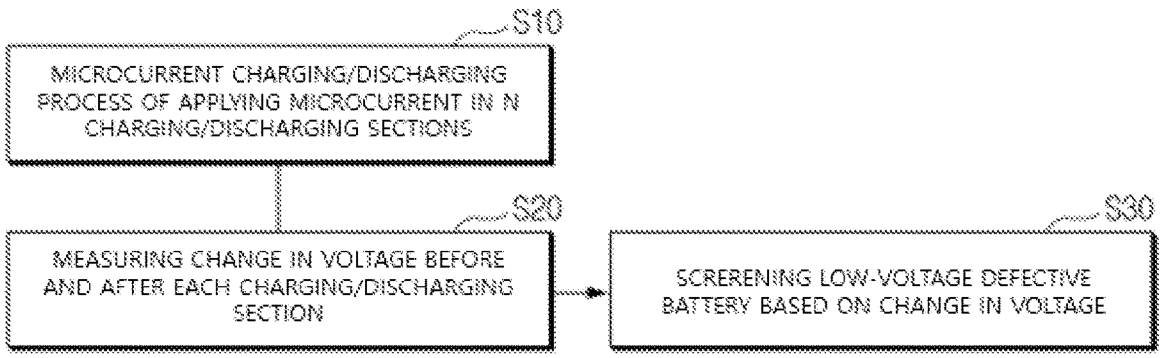
[FIG. 2]
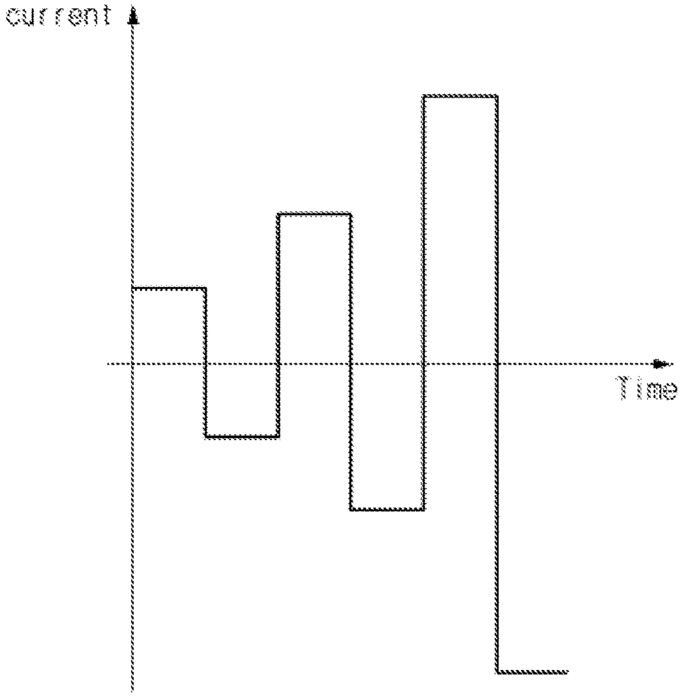

[FIG. 3]
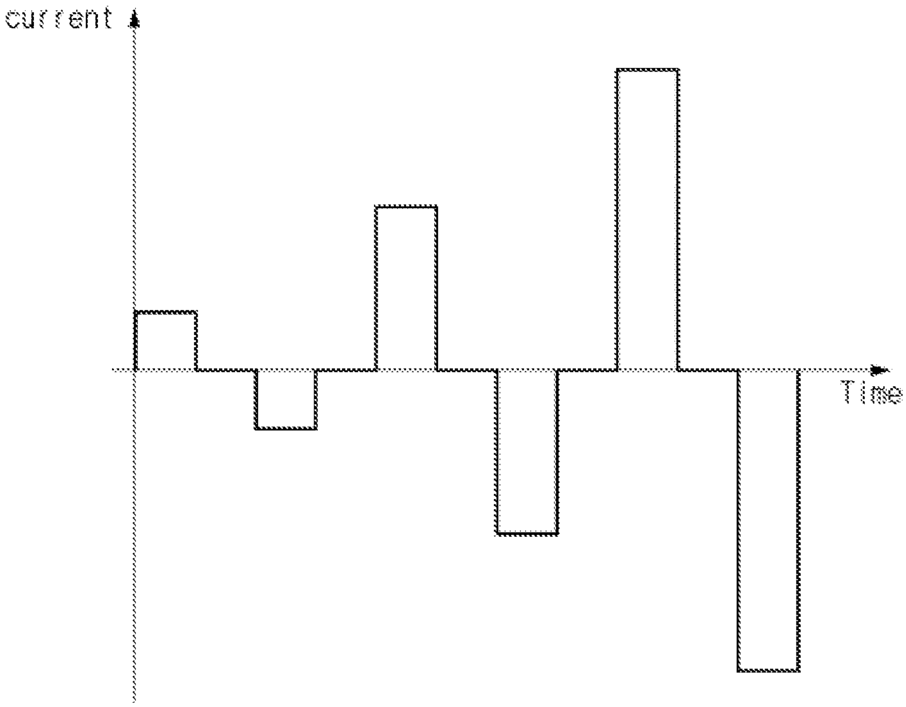
[FIG. 4]
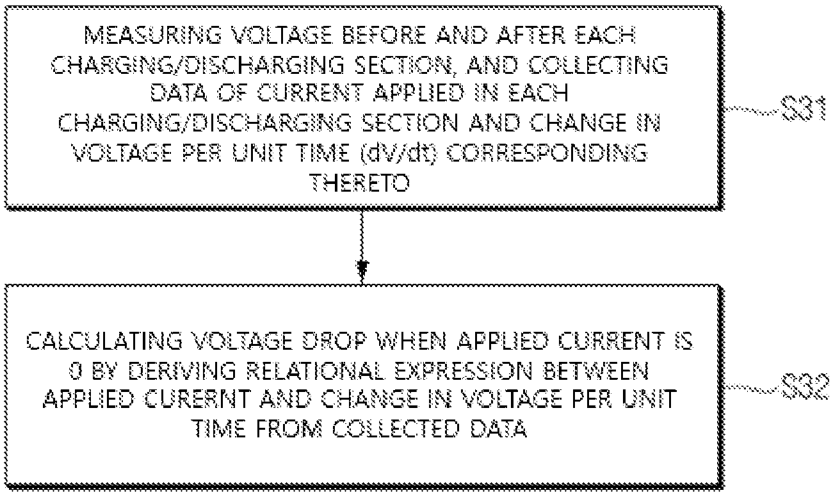

[FIG. 5]
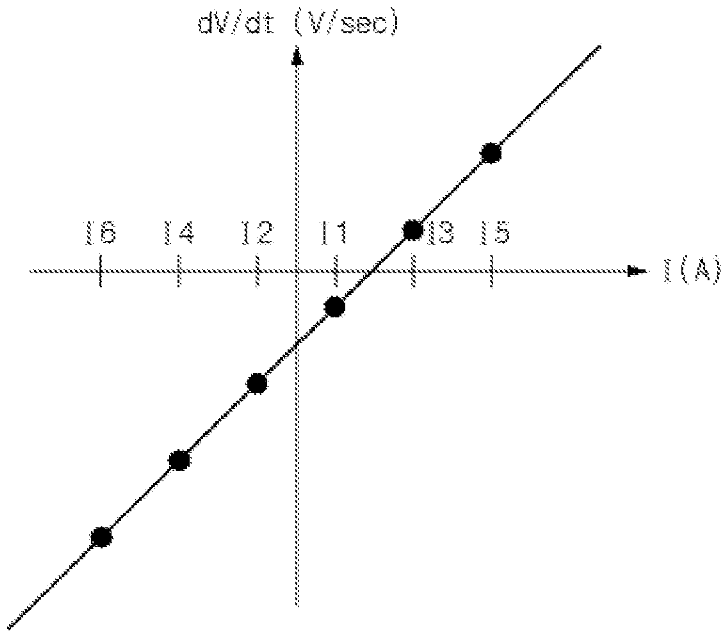
[FIG. 6]
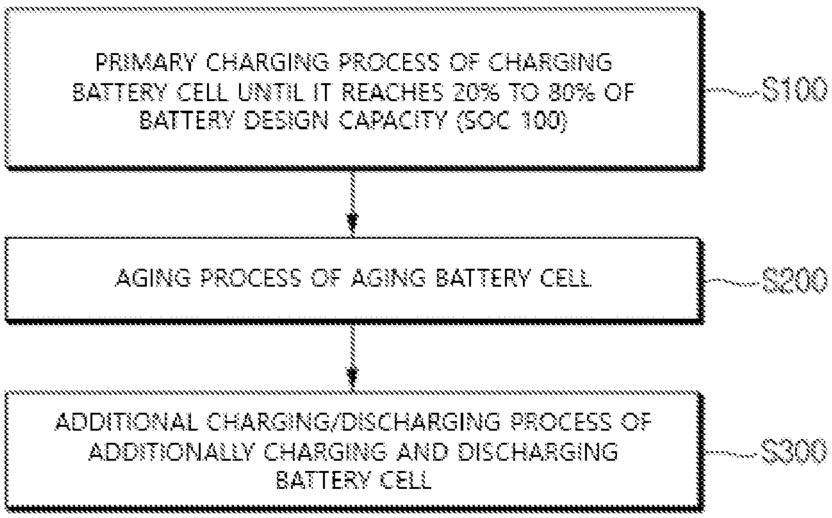

LOW-VOLTAGE DEFECT INSPECTION METHOD OF LITHIUM SECONDARY BATTERY AND MANUFACTURING METHOD OF LITHIUM SECONDARY BATTERY

TECHNICAL FIELD

This application claims the benefit of priority based on Korean Patent Application No. 10-2022-0010369 filed on Jan. 25, 2022.

The present invention relates to a low-voltage defect inspection method significantly reducing inspection time with regard to inspecting low voltage defective batteries, and a manufacturing method of lithium secondary battery using thereto.

BACKGROUND TECHNOLOGY OF THE INVENTION

As the technology development and demand for mobile devices increase, the demand for secondary batteries as an energy source is rapidly increasing, and among them, lithium secondary batteries exhibiting high energy density, high operating potential, long cycle life, and low self-discharge rate have been commercialized and widely used.

The lithium secondary battery goes through an activation process after an electrode assembly is assembled together with an electrolyte inside a battery case. The activation process stabilizes the battery structure and makes it usable through processes of charging, aging, and discharging the assembled battery.

These lithium secondary batteries may have various types of defects due to various causes during the manufacturing process or during use. Particularly, some of the secondary batteries that have been manufactured show a phenomenon in which a voltage drop behavior is higher than the self-discharge rate, and this phenomenon is referred to as low voltage.

In many cases, such a low-voltage defect phenomenon of a secondary battery is typically caused by a metal foreign material located in the inside. In particular, when a metal foreign material such as iron or copper is present in a positive electrode plate of the secondary battery, the foreign material may grow into a dendrite in a negative electrode. In addition, such dendrites cause an internal short circuit of the secondary battery, which may cause malfunction or damage of the secondary battery, and in severe cases, it may cause ignition. Accordingly, the manufacturing process of the secondary battery includes a process of screening low-voltage defective batteries.

Conventionally, in order to screen low-voltage defective batteries, OCV (Open Circuit Voltage) is measured at two selected time points during an aging process, and the change value (voltage drop) of OCV is compared to a reference value to determine the secondary battery having voltage drop that exceeds the reference value as defective.

However, since the change in voltage should be monitored for several days or tens of days to screen low-voltage defective batteries by the above method, it takes a lot of time to screen low-voltage defective batteries, resulting in a decrease in productivity. Therefore, it is necessary to develop a technology capable of reducing the time required to screen low-voltage defective batteries.

DESCRIPTION OF THE INVENTION

Technical Problem

The present invention is directed to solve the above problems, and provides a method for reducing the time required for screening low-voltage defective batteries.

Technical Solution

An inspection method for a low-voltage defect of a lithium secondary battery according to the present invention includes: performing a microcurrent charging/discharging process having N charging/discharging sections, N being an integer of 2 or more, applying a microcurrent to the lithium secondary battery in each charging/discharging section; measuring a change in voltage of the lithium secondary battery before and after each charging/discharging section; screening for the low-voltage defect of the lithium secondary battery based on the measured change in voltage, wherein the microcurrent for each charging/discharging section is at a current rate of 0.000001 C to 0.0001 C.

In an exemplary embodiment of the present invention, the current rate of each charging/discharging section may increase stepwise or may decrease stepwise as the N increases.

In an exemplary embodiment of the present invention, the microcurrent applied during each charging/discharging section may be a constant current during each charging/discharging section.

In an exemplary embodiment of the present invention, each charging/discharging section may be performed for 1 minute to 30 minutes.

In an exemplary embodiment of the present invention, the microcurrent charging/discharging process may further include a resting period during each charging/discharging section_or between the charging/discharging sections.

In an exemplary embodiment of the present invention, the resting period may stop charging or discharging for 1 minute to 30 minutes.

In an exemplary embodiment of the present invention, in the microcurrent charging/discharging process, the N is an integer from 2 to 10.

In an exemplary embodiment of the present invention, the microcurrent charging/discharging process may have a same charging rate and discharging rate for each charging/discharging section.

In an exemplary embodiment of the present invention, a total time required for the microcurrent charging/discharging process may be 10 minutes to 6 hours.

In an exemplary embodiment of the present invention, the screening process may include: plotting the current applied in each charging/discharging section and the corresponding change in voltage per unit time (dV/dt); predicting the voltage drop at the point where the applied current is 0 in the graph derived through the above plotting process.

A manufacturing method of a lithium secondary battery according to the present invention includes: activating the lithium secondary battery by charging the lithium secondary batter; and performing the inspection method described above.

In an exemplary embodiment of the present invention, the inspection method is performed at any one or more selected from the following time points:

(1) after a primary charging process of charging the lithium secondary battery;

(2) after the primary charging process and an aging process of the lithium secondary battery; and (3) after the primary charging process, the aging process, and an additional charging/discharging process of additionally charging and discharging the lithium secondary battery after the primary charging.

In an exemplary embodiment of the present invention, the inspection method is performed after performing a stabilization process of stabilizing the battery cell at a certain temperature after a time point selected among (1) to (3).

Advantageous Effects

The low-voltage defect inspection method according to the present invention has an effect of improving productivity by significantly reducing inspection time, which previously took several days to several tens of days, to within several hours.

BRIEF DESCRIPTION OF THE DRAWING

FIG. 1 is a flowchart of a low-voltage defect battery detection method according to an exemplary embodiment of the present invention.

FIG. 2 is a schematic diagram showing a microcurrent pattern applied in a microcurrent charging/discharging process according to an exemplary embodiment of the present invention.

FIG. 3 is a schematic diagram showing a microcurrent pattern applied in a microcurrent charging/discharging process according to another exemplary embodiment of the present invention.

FIG. 4 is a flowchart of a screening process according to an exemplary embodiment of the present invention.

FIG. 5 is a graph obtained by plotting a change in voltage per unit time corresponding to an applied current value in each charging/discharging section according to an exemplary embodiment of the present invention.

FIG. 6 is a flowchart of a manufacturing method of a lithium secondary battery according to an exemplary embodiment of the present invention.

BEST MODE FOR CARRYING OUT THE INVENTION

Hereinafter, preferred exemplary embodiments of the present invention will be described in detail with reference to the accompanying drawings. Prior to this, the terms or the words used in this specification and claims should not be construed as being limited to ordinary or dictionary meanings, and should be interpreted as meanings and concepts consistent with the technical idea of the present invention based on the principle that the inventor can appropriately define the concept of the terms in order to explain his/her invention in the best way.

Therefore, the exemplary embodiments described in this specification and the configurations shown in the drawings are only one of the most preferred exemplary embodiments of the present invention, and do not represent all the technical ideas of the present invention, so it should be understood that there may be various equivalents and variations that may substitute them at the time of this application.

FIG. 1 is a flowchart of a low-voltage defect battery detection method according to an exemplary embodiment of the present invention, FIG. 2 is a schematic diagram showing a microcurrent pattern applied in a microcurrent charging/discharging process according to an exemplary embodiment of the present invention, and FIG. 3 is a schematic diagram showing a microcurrent pattern applied in a microcurrent charging/discharging process according to another exemplary embodiment of the present invention.

Referring to FIG. 1, the low-voltage defect inspection method according to the present invention includes: a microcurrent charging/discharging process consisting of N (N is an integer of 2 or more) charging/discharging sections, and applying a microcurrent to a battery cell in each charging/discharging section S10; measuring the change in voltage before and after each of the charging/discharging section S20; and a screening process of screening low-voltage defective batteries based on the change in voltage S30, wherein each of the charging/discharging section comprises applying a current at a current rate of 0.000001 C to 0.0001 C.

The inventors of the present invention have found that in the case of a low-voltage battery, when the battery cell is charged and discharged at a rate of 0.000001 C to 0.0001 C, but as shown in FIG. 2, when there is a pattern to the applied current rate, the change in voltage was large compared to a normal battery, thereby leading to the present invention. Since the low-voltage defect inspection method according to the present invention charges and discharges with a very small amount of current in the microcurrent charging and discharging process, there is an effect of reducing the time required for detecting a battery cell exhibiting a voltage drop behavior to several tens of minutes to several hours. This is a drastically shortened inspection time compared to the time required for a conventional inspection method, which used to take several days to tens of days.

The microcurrent charging/discharging process S10 is a process of charging and discharging by applying a microcurrent to the battery cell, consisting of N charging/discharging sections, and each charging/discharging section performs charging and discharging. That is, the microcurrent charging/discharging process of the present invention may consist of a first charging/discharging section to an $N^{th}$ charging/discharging section, and each charging/discharging section includes a charging and discharging process. In this case, N may be an integer of 2 to 10, preferably an integer of 2 to 8, and more preferably an integer of 3 to 6. When there are too many charging/discharging sections, the process may be complicated, which is not preferable, and when there are too few charging/discharging sections, variation in change in voltage may be large, which is not preferable.

Referring to FIG. 2, the microcurrent charging/discharging process according to an exemplary embodiment of the present invention may not have a resting period between charging and discharging, and referring to FIG. 3, the microcurrent charging/discharging process according to another exemplary embodiment of the present invention may further include a resting period in at least one or more among between the charging and discharging or between charging/discharging sections.

The resting period is to stop charging or discharging, and specifically, to leave the charged/discharged battery cells for a predetermined time. The resting period may be 1 minute to 30 minutes, preferably 2 minutes to 20 minutes, and more preferably 3 minutes to 15 minutes. In the present invention, when there is no resting period between charging and discharging or between discharging and charging, noise may occur in the voltage at the beginning of changing the applied current value, so it is preferable to have a rest period in at least one or more among between charging and discharging or between charging/discharging processes.

In the microcurrent charging/discharging process S10, a constant current may be applied as the current applied in one charging/discharging section. As shown in FIG. 2 and FIG. 3, in the microcurrent charging/discharging process, as the charging/discharging section progresses, the rate of the current being applied seems to increase gradually/stepwise, but in a single charging/discharging section, charging and discharging can be done at a constant current rate. In FIG. 2, charging is indicated as a current rate having a positive value and discharging is indicated as a current rate having a negative value. Positive/negative corresponds to charging and discharging, respectively, and the absolute values of the current rates may be the same, or may be different. That is, in one charging/discharging section, the absolute value of the current rate during charging and the absolute value of the current rate during discharging may be mutually the same, or the absolute value of the current rate during charging and the absolute value of the current rate during discharging may be mutually different. However, when cases in which the absolute values of the current rates during charging and discharging are different accumulate, the voltage of the battery cell may fluctuate as a whole, so it is desirable that the absolute value of each current rate of charging and discharging are the same. That is, in a single charging/discharging section, it is desirable that the charging rate and the discharging rate are the same.

When a microcurrent is applied, the present invention alternately performs charging and discharging at a rate of 0.000001 C to 0.0001 C, which represents the lower limit and the upper limit of the charging/discharging rate that can be applied in the entire section of the microcurrent charging/discharging process. That is, the current rate applied in the microcurrent charging/discharging section may be a value selected from the above range.

In addition, in the microcurrent charging/discharging process of the present invention, the current rate of each charging/discharging section may increase stepwise or decrease stepwise as the N increases. As shown in FIG. 2 and FIG. 3, current rate of the charging/discharging section increasing as the N increases means that the charging/discharging rate of the second charging/discharging section is greater than the charging/discharging rate of the first charging/discharging section, and that the charging/discharging rate of the third charging/discharging section is greater than the charging/discharging rate of the second charging/discharging section, and current rate of the charging/discharging section decreasing as N increases means the other way around.

In the microcurrent charging/discharging process, it is preferable to perform the charging/discharging in one charging/discharging section for 1 minute to 30 minutes, more preferably 2 minutes to 20 minutes, and more preferably 3 minutes to 15 minutes, respectively.

In addition, the total time required for the microcurrent charging/discharging process in which the charging-resting-discharging is alternately performed may be 10 minutes to 6 hours, preferably 20 minutes to 4 hours, and more preferably 30 minutes to 3 hours.

The process of measuring the change in voltage S20 includes a process of measuring the change in voltage before and after each charging/discharging section. Unlike the conventional screening method, the method for screening low-voltage defective batteries according to the present invention screens low-voltage batteries based on voltage response characteristics after a microcurrent is applied. In the microcurrent charging/discharging process, since charging and discharging are performed by applying microcurrent for each N number of charging/discharging sections, the process of measuring the change in voltage S20 may include a process of measuring the voltage of the battery for each N number of charging/discharging sections, calculating the change in voltage before and after the charging/discharging section, and collecting data of the change in voltage.

In the low-voltage defective battery inspection method according to the present invention, since the battery cell is charged and discharged with a microcurrent in the microcurrent charging/discharging process, the voltage measured from the change in voltage may vary depending on the material of the electrode or the capacity of the battery, but it has a unit of several microvolts to hundreds of microvolts.

The screening process S30 is a process of screening low-voltage defective batteries based on the change in voltage measured in the process of measuring the change in voltage.

FIG. 4 is a flowchart of a screening process according to an exemplary embodiment of the present invention. Referring to FIG. 4, the screening process S30 includes: measuring voltage before and after each charging/discharging section, and collecting data of a current applied in each charging/discharging section and a change in voltage (dV/dt) per unit time corresponding thereto; and calculating the voltage drop when the applied current is 0 by deriving a relational expression between the applied current and the change in voltage per unit time from the collected data.

FIG. 5 is a graph obtained by plotting a change in voltage per unit time corresponding to an applied current value in each charging/discharging section according to an exemplary embodiment of the present invention. Referring to FIG. 5, the x-axis represents the applied current of each charging/discharging section, the y-axis represents the change in voltage per unit time, and the change in voltage per hour corresponding to the applied current is indicated by dots. When a plurality of dots is connected, a formula can be derived, and the voltage drop when the applied current is 0 can be calculated from the derived formula. Although a plurality of dots is shown as a linear equation function in FIG. 5, the correlation function between the applied current and the change in voltage per unit time is not limited thereto, and it is possible to derive a formula of the change in voltage per time according to the applied current based on the plurality of dots using a known statistical method such as a linear regression, etc.

The low-voltage defective battery inspection method according to the present invention has an advantage in that it can be used in any process among the manufacturing process of lithium secondary battery because it applies a microcurrent to the battery cell, thereby having a small effect on the battery.

Hereinafter, a manufacturing method of a lithium secondary battery according to the present invention will be described.

The manufacturing method of a lithium secondary battery according to an exemplary embodiment of the present invention includes: activating by charging an assembled battery cell; and the low-voltage defect inspection process.

The assembled battery cell may refer to a battery cell manufactured through a process of accommodating an electrode assembly in which a positive electrode, a separator, and a negative electrode are sequentially stacked into a battery case, injecting an electrolyte, and sealing the battery case.

After the assembly of the battery is completed as such, a pre-aging process may be performed in which the battery cell is left for a predetermined period of time in order to sufficiently impregnate the electrode assembly with the electrolyte before starting the activation process of the battery cell.

The process of activating the battery cell is a process of forming a battery into a usable state by charging an assembled battery cell and allowing an electrode and an electrolyte constituting a battery to undergo an electrochemical reaction. This activation process includes a process of charging a battery cell, and may further include a process of discharging after charging, or may further include an aging process of aging a battery cell by leaving it for a predetermined time after charging.

FIG. 6 is a flowchart of a manufacturing method of a lithium secondary battery according to an exemplary embodiment of the present invention. Referring to FIG. 6, the manufacturing method of a lithium secondary battery according to an exemplary embodiment of the present invention includes: a primary charging process S100 of charging the battery cell until it reaches 20% to 80% of the battery design capacity; an aging process S200 of aging the battery cell; an additional charging/discharging process S300 of additionally charging and discharging the battery cell; and the aforementioned low-voltage defect inspection process.

However, the present invention is not limited to the above embodiment, and the battery may be shipped after passing through the low-voltage defect inspection process after the primary charging process, and after the primary charging and the aging processes, the battery screened according to the low-voltage defect inspection process may be shipped.

Also, the low-voltage defect inspection process is performed at any one or more selected from the following time points (1) to (3).

(1) After a primary charging process of charging an assembled battery cell (2) After the primary charging process and an aging process of leaving a battery cell for a predetermined time (3) After the primary charging process, the aging process, and an additional charging/discharging process of additionally charging and discharging a battery cell after the primary charging In addition, after one time point selected among the (1) to (3), a stabilization process of stabilizing the battery cell at a constant temperature may be performed, and then the low-voltage defect inspection process may be performed.

In an exemplary embodiment of the present invention, the primary charging process S100 is a process of charging an assembled secondary battery to 20% to 80% of the state of charge (SOC) of the secondary battery in order to form a Solid Electrolyte Interface (hereinafter referred to as "SET") film layer of the negative electrode. The upper limit charge capacity of the primary charging may be appropriately selected considering the type of the battery, the capacity of the battery, and the characteristics of the positive and negative electrodes constituting the battery, and specifically, it may be SOC 25% to SOC 75%, or SOC 30% to SOC 65%.

The primary charging process may be performed under charging conditions according to methods known in the art. Specifically, the charging method may perform charging in a constant current method until the charging end voltage is reached. Here, the charging rate (c-rate) may be 0.01 C to 2 C, 0.1 C to 1.5 C, and 0.2 C to 1 C, but is not necessarily limited thereto, and may be appropriately adjusted according to the type of battery, the capacity, and the material characteristics of the positive electrode and the negative electrode.

In addition, the temperature condition of the primary charging process may be carried out at 18° C. to 28° C., specifically 19° C. to 27° C., and more specifically 20° C. to 26° C., or it may be alternatively carried out under high temperature condition of 40° C. to 70° C. In addition, the primary charging process may perform charging while pressurizing the secondary battery. Specifically, the primary charging process may be performed while being loaded on a jig formation device capable of pressurizing the secondary battery even during charging.

Here, the pressure for pressurizing the secondary battery may be 0.1 kgf/cm$^2$ to 10 kgf/cm$^2$, preferably 0.3 kgf/cm$^2$ to 7.5 kgf/cm$^2$, and more preferably 0.5 kgf/cm$^2$ to 5 kgf/cm$^2$.

The aging process S200 is a process of aging the battery by leaving the battery at a constant temperature. The aging process may be performed under various conditions to accelerate the stabilization of the SEI film formed through the primary charging process. Specifically, it may include a room temperature aging process of aging the secondary battery at room temperature for a predetermined period of time, and depending on the purpose, it may further include a high temperature aging process of aging the secondary battery at a high temperature, and both the room temperature aging and the high temperature aging can be performed. The high temperature aging ages the battery in a high temperature environment, and it can accelerate the stabilization of the SEI film, and the high temperature aging and the room temperature aging processes can be sequentially performed on the initially charged battery.

In one specific example, the high temperature aging may be performed at a temperature of 50° C. to 100° C., preferably 50° C. to 80° C. The high temperature aging may be performed for 1 to 30 hours, preferably 2 to 24 hours. The high temperature aging accelerates the stabilization of the SEI film and reduces the voltage drop due to self-discharge of the normal battery, thereby further improving the selectivity of the battery to distinguish good batteries from low-voltage defective batteries.

In one specific example, the room temperature aging may be performed at a temperature of 18° C. to 28° C., specifically 19° C. to 27° C., more specifically 20° C. to 26° C., and even more specifically 21° C. to 25° C. The room temperature aging may be performed for 12 to 120 hours, or 18 to 72 hours.

The additional charging/discharging process S300 is a process of additionally charging and discharging the secondary battery, and specifically, it may be performed by a full discharge and a full charge process of completely discharging the secondary battery to near SOC 0 and then charging it to 95% (SOC 95%) or more of the design capacity of the discharged secondary battery; or by charging the secondary battery to 80% (SOC 80%) or more of the design capacity, completely discharging the secondary battery to near SOC 0, and then charging back the secondary battery to 95% (SOC 95%) or more of the design capacity of the secondary battery; or by repeating the full discharge and the full charge processes two or more times, but is not limited thereto.

Hereinafter, the present invention will be described in detail using exemplary embodiments to aid the understanding of the present invention. However, the exemplary embodiments according to the present invention may be modified in many different forms, and it should not be construed that the scope of the present invention is limited to the following exemplary embodiments. The exemplary embodiments of the present invention are provided to more completely explain the present invention to those skilled in the art.

Preparation Example 1: Preparation of Good Lithium Secondary Battery 96.7 parts by weight of $Li[Ni_{0.6}Mn_{0.2}Co_{0.2}]O_2$ functioning as a positive electrode active material, 1.3 parts by weight of graphite functioning as a conductor, and 2.0 parts by weight of polyvinylidene fluoride (PVdF) functioning as a binder were mixed to prepare a positive electrode mixture. A positive electrode mixture slurry was prepared by dispersing the prepared positive electrode mixture in 1-methyl-2-pyrrolidone functioning as a solvent. This slurry was coated on both sides of an aluminum foil with a thickness of 20 μm, dried, and pressurized to prepare a positive electrode.

97.6 parts by weight of artificial graphite and natural graphite (weight ratio: 90:10) functioning as a negative electrode active material, 1.2 parts by weight of styrene-butadiene rubber (SBR) functioning as a binder, and 1.2 parts by weight of carboxymethyl cellulose (CMC) were mixed to prepare a negative electrode mixture. A negative electrode mixture slurry was prepared by dispersing this negative electrode mixture in ion-exchanged water functioning as a solvent. This slurry was coated on both sides of a copper foil with a thickness of 20 μm, dried, and pressurized to prepare a negative electrode.

A non-aqueous electrolyte was prepared by dissolving $LiPF_6$ in an organic solvent mixed with ethylene carbonate (EC), propylene carbonate (PC), and diethyl carbonate (DEC) in a composition of 3:3:4 (volume ratio) so that its concentration becomes 1.0M.

The positive electrode and the negative electrode prepared above were stacked with a porous polyethylene separator interposed therebetween, and were stored in a pouch, and the electrolyte was injected to complete the assembly of the lithium secondary battery.

Preparation Example 2: Preparation of Defective Lithium Secondary Battery

A lithium secondary battery was prepared as in the above Preparation Example, but copper particles having a diameter of 100 μm were introduced to complete the assembly of the defective battery so that the micro short-circuit resistance during the process of assembling the positive electrode, the negative electrode, and the separator, was 10 kΩ.

Example 1

Ten assembled lithium secondary batteries of Preparation Example 1 were prepared and were pre-aged by aging for 24 hours at room temperature of 25° C. The pre-aged secondary batteries were loaded to a formation jig, and a primary charging process was performed by charging the secondary battery until it reached SOC 45% while pressurizing it at a temperature of 25° C. The battery that has gone through the primary charging was aged for 24 hours at a high temperature of 60° C., and then was aged for 12 hours at room temperature of 25° C.

Thereafter, a microcurrent charging/discharging process consisting of three charging/discharging sections was performed, but a resting period was included between charging and discharging (first charge—resting period—first discharge—resting period—second charge—resting period—second discharge—resting period—third charge—resting period—third discharge). Here, the microcurrent charging/discharging process was performed by setting the first charge and the first discharge to be charged and discharged for 10 minutes at a rate of 0.000001 C, respectively, the second charge and the second discharge to be charged and discharged for 10 minutes at a rate of 0.000002 C, respectively, the third charge and the third discharge to be charged and discharged for 10 minutes at a rate of 0.000004 C, respectively, and the resting periods to be 10 minutes, respectively.

In addition, the voltage of the battery was measured before and after each charging/discharging section, and a graph was obtained by plotting the change in voltage per hour corresponding to the applied current in each charging/discharging section. In the graph, the voltage drop when the applied current is 0 was calculated (predicting process of voltage drop), and the average value and the deviation of the voltage drop for ten batteries were shown in Table 1.

Example 2

Ten assembled lithium secondary batteries of Preparation Example 2 were prepared, and in the same manner as in Example 1, pre-aging, primary charging, aging process, microcurrent charging/discharging process, measuring change in voltage, and predicting process of voltage drop were performed, and the average value and the deviation of voltage drop were shown in Table 1.

Example 3

Ten assembled lithium secondary batteries of Preparation Example 1 were prepared and were pre-aged by aging for 24 hours at room temperature of 25° C. The pre-aged secondary batteries were loaded to a formation jig, and a primary charging process was performed by charging the secondary battery until it reached SOC 45% while pressurizing it at a temperature of 25° C. The battery that has gone through the primary charging was aged for 24 hours at a high temperature of 60° C., and then was aged for 12 hours at room temperature of 25° C.

Thereafter, a microcurrent charging/discharging process consisting of three charging/discharging sections was performed, but a resting period was included between charging and discharging (first charge—resting period—first discharge—resting period—second charge—resting period—second discharge—resting period—third charge—resting period—third discharge). Here, the microcurrent charging/discharging process was performed by setting the first charge and the first discharge to be charged and discharged for 10 minutes at a rate of 0.000001 C, respectively, the second charge and the second discharge to be charged and discharged for 10 minutes at a rate of 0.000003 C, respectively, the third charge and the third discharge to be charged and discharged for 10 minutes at a rate of 0.000006 C, respectively, and the resting periods to be 10 minutes, respectively.

Then, in the same manner as in Example 1, the voltage drop when the applied current is 0 was calculated (predicting process of voltage drop), and the average value and the deviation of the voltage drop for ten batteries were shown in Table 1.

Example 4

Ten assembled lithium secondary batteries of Preparation Example 2 were prepared, and in the same manner as in Example 3, aging process, microcurrent charging/discharging process, measuring change in voltage, and predicting process of voltage drop were performed, and the average value and the deviation of voltage drops were shown in Table 1.

Comparative Example 1

Ten assembled lithium secondary batteries of Preparation Example 1 were prepared and were pre-aged by aging for 24 hours at room temperature of 25° C. The pre-aged secondary batteries were loaded to a formation jig, and a primary charging process was performed by charging the secondary battery until it reached SOC 45% while pressurizing it at a temperature of 25° C. The battery that has gone through the primary charging was aged for 24 hours at a high temperature of 60° C., and then was aged for 12 hours at room temperature of 25° C.

An open circuit voltage of the battery cell was measured immediately after the aging (OCV1), and an open circuit voltage of the battery was measured when 3 hours have elapsed (OCV2) to calculate the change in voltage per unit time (dV/dmin) and the average value and the deviation were shown in Table 1.

Comparative Example 2

Ten assembled lithium secondary batteries of Preparation Example 2 were prepared, and in the same manner as in Example 1, pre-aging, primary charging, high temperature aging, room temperature aging, and calculating change in voltage per unit time were performed, and the average value and the deviation were shown in Table 1.

TABLE 1

| | Average Value (μV/min) | Standard Deviation |
|---|---|---|
| Example 1 | 2.25 | 0.41 |
| Example 2 | 5.80 | 0.43 |
| Example 3 | 2.18 | 0.44 |
| Example 4 | 6.03 | 0.39 |
| Comparative Example 1 | 1.33 | 1.74 |
| Comparative Example 2 | 1.34 | 1.44 |

Referring to Table 1, in the low-voltage defect inspection method according to the Comparative Examples, the change in voltage per unit time that appeared within several hours was similar in the good (Comparative Example 1) and the defective (Comparative Example 2). On the other hand, in the low-voltage defect inspection method according to the Examples, the change in voltage per unit time that appeared within several hours had a value that clearly distinguishes the good (Example 1, Example 3) from the defective (Example 2, Example 4). Therefore, it is evaluated that the low-voltage defect inspection method according to the present invention can significantly reduce the time required for screening low-voltage defective batteries.

The invention claimed is:

1. An inspection method for a low-voltage defect of a lithium secondary battery, the inspection method comprising:

performing a microcurrent charging/discharging process having N charging/discharging sections, N being an integer of 2 or more, and for each charging/discharging section, applying a microcurrent to the lithium secondary battery;

measuring a change in voltage of the lithium secondary battery before and after each charging/discharging section; and screening for the low-voltage defect of the lithium secondary battery based on the measured change in voltage, wherein the microcurrent for each charging/discharging section is at a current rate of 0.000001 C to 0.0001 C.

2. The inspection method of claim 1, wherein the current rate of each charging/discharging section increases stepwise or decreases stepwise as the N increases.

3. The inspection method of claim 1, wherein the microcurrent applied during each charging/discharging section is a constant current during each charging/discharging section.

4. The inspection method of claim 1, wherein each charging/discharging section is performed for 1 minute to 30 minutes.

5. The inspection method of claim 1, wherein the microcurrent charging/discharging process further comprises a resting period during each charging/discharging section or between the charging/discharging sections.

6. The inspection method of claim 5, wherein the resting period stops charging or discharging for 1 minute to 30 minutes.

7. The inspection method of claim 1, wherein, in the microcurrent charging/discharging process, the N is an integer from 2 to 10.

8. The inspection method of claim 1, wherein the microcurrent charging/discharging process has a same charging rate and discharging rate for each charging/discharging section.

9. The inspection method of claim 1, wherein a total time required for the microcurrent charging/discharging process is 10 minutes to 6 hours.

10. The inspection method of claim 1, wherein the screening process comprises:

measuring voltage before and after each charging/discharging section;

collecting data of the microcurrent applied in each charging/discharging section and a change in voltage per unit time (dV/dt) corresponding thereto; and calculating a voltage drop when the applied current is 0 by deriving a relational expression between the applied microcurrent and the change in voltage per unit time from the collected data.

11. A manufacturing method of a lithium secondary battery, the manufacturing method comprising:

activating the lithium secondary battery by charging the lithium secondary battery; and preforming the inspection method of claim 1.

12. The manufacturing method of claim 11, wherein the inspection method is performed at any one or more selected from the following time point:

(1) after a primary charging process of charging the lithium secondary battery;

(2) after the primary charging process and an aging process of the lithium secondary battery; and (3) after the primary charging process, the aging process, and an additional charging/discharging process of additionally charging and discharging the lithium secondary battery after the primary charging.

13. The manufacturing method of claim 12, wherein the inspection method is performed after performing a stabilization process of stabilizing the battery cell at a certain temperature after a time point selected from (1) to (3).

* * * * *